US012805218B2

(12) United States Patent
Takamura et al.

(10) Patent No.: US 12,805,218 B2
(45) Date of Patent: Nov. 17, 2026

(54) DEPOSITION METHOD AND DEPOSITION APPARATUS

(71) Applicant: Tokyo Electron Limited, Tokyo (JP)

(72) Inventors: Yuya Takamura, Iwate (JP); Jun Sato, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 414 days.

(21) Appl. No.: 18/505,334

(22) Filed: Nov. 9, 2023

(65) Prior Publication Data

US 2024/0170281 A1 May 23, 2024

(30) Foreign Application Priority Data

Nov. 22, 2022 (JP) ................................ 2022-186438

(51) Int. Cl.

| | |
|---|---|
| ***H10P 14/60*** | (2026.01) |
| ***C23C 16/04*** | (2006.01) |
| ***C23C 16/40*** | (2006.01) |
| ***C23C 16/458*** | (2006.01) |
| ***C23C 16/56*** | (2006.01) |
| ***H01J 37/32*** | (2006.01) |
| ***H10P 14/692*** | (2026.01) |

(52) U.S. Cl.

CPC ........ *H10P 14/6336* (2026.01); *C23C 16/045* (2013.01); *C23C 16/401* (2013.01); *C23C 16/4584* (2013.01); *C23C 16/56* (2013.01); *H01J 37/32449* (2013.01); *H01J 37/32715* (2013.01); *H01J 37/32816* (2013.01); *H10P 14/6339* (2026.01); *H10P 14/6532* (2026.01); *H10P 14/69215* (2026.01); *H01J 2237/2001* (2013.01); *H01J 2237/20214* (2013.01); *H01J 2237/332* (2013.01)

(58) Field of Classification Search

CPC ............ H10P 14/6336; H10P 14/6532; C23C 16/045; H01J 37/32449

See application file for complete search history.

(56) References Cited

U.S. PATENT DOCUMENTS

2016/0379868 A1* 12/2016 Sato .................. H10P 14/69215 438/703
2018/0308688 A1* 10/2018 Kato ..................... C23C 16/045

FOREIGN PATENT DOCUMENTS

JP 2013-135154 7/2013

* cited by examiner

*Primary Examiner* — Douglas M Menz
(74) *Attorney, Agent, or Firm* — IPUSA, PLLC

(57) ABSTRACT

A deposition method includes: a) depositing a film of a reaction product of a first reaction gas and a second reaction gas that react with each other in the recess; and b) exposing the substrate on which the film is deposited to a plasma generated from a noble gas. a) includes: a1) exposing the substrate to a plasma generated from the noble gas and a modifying gas to adsorb a hydroxyl group on an inner surface of the recess in a predetermined distribution, a2) supplying the first reaction gas to the substrate on which the hydroxyl group is adsorbed, and a3) supplying the second reaction gas to the substrate on which the first reaction gas is adsorbed, thereby causing the first reaction gas to react with the second reaction gas to produce the reaction product.

15 Claims, 11 Drawing Sheets

DEPOSITION METHOD AND DEPOSITION APPARATUS

CROSS-REFERENCE TO RELATED APPLICATIONS

The present application is based on and claims priority to Japanese Patent Application No. 2022-186438 filed on Nov. 22, 2022, the contents of which are incorporated herein by reference in their entirety.

BACKGROUND OF THE INVENTION

Field of the Invention

The present disclosure relates to a deposition method and a deposition apparatus.

Description of the Related Art

A technique is known to deposit a film of a reaction product of a first reaction gas and a second reaction gas that reacts with the first reaction gas in a recess formed on a substrate (see, for example, Japanese Laid-Open Patent Publication No. 2013-135154). In Japanese Laid-Open Patent Publication No. 2013-135154, the distribution of the film thickness of the film deposited in the recess is controlled by adsorbing a hydroxyl group in a predetermined distribution on an inner surface of the recess and then supplying the first reaction gas and the second reaction gas in this order.

SUMMARY OF THE INVENTION

According to one aspect of the present disclosure, a deposition method for forming a film in a recess of a substrate having the recess on a surface thereof, the method includes: a) depositing a film of a reaction product of a first reaction gas and a second reaction gas that react with each other in the recess; and b) exposing the substrate on which the film is deposited to a plasma generated from a noble gas. a) includes: a1) exposing the substrate to a plasma generated from the noble gas and a modifying gas to adsorb a hydroxyl group on an inner surface of the recess in a predetermined distribution, a2) supplying the first reaction gas to the substrate on which the hydroxyl group is adsorbed, and a3) supplying the second reaction gas to the substrate on which the first reaction gas is adsorbed, thereby causing the first reaction gas to react with the second reaction gas to produce the reaction product.

DESCRIPTION OF THE EMBODIMENTS

Figure 1:
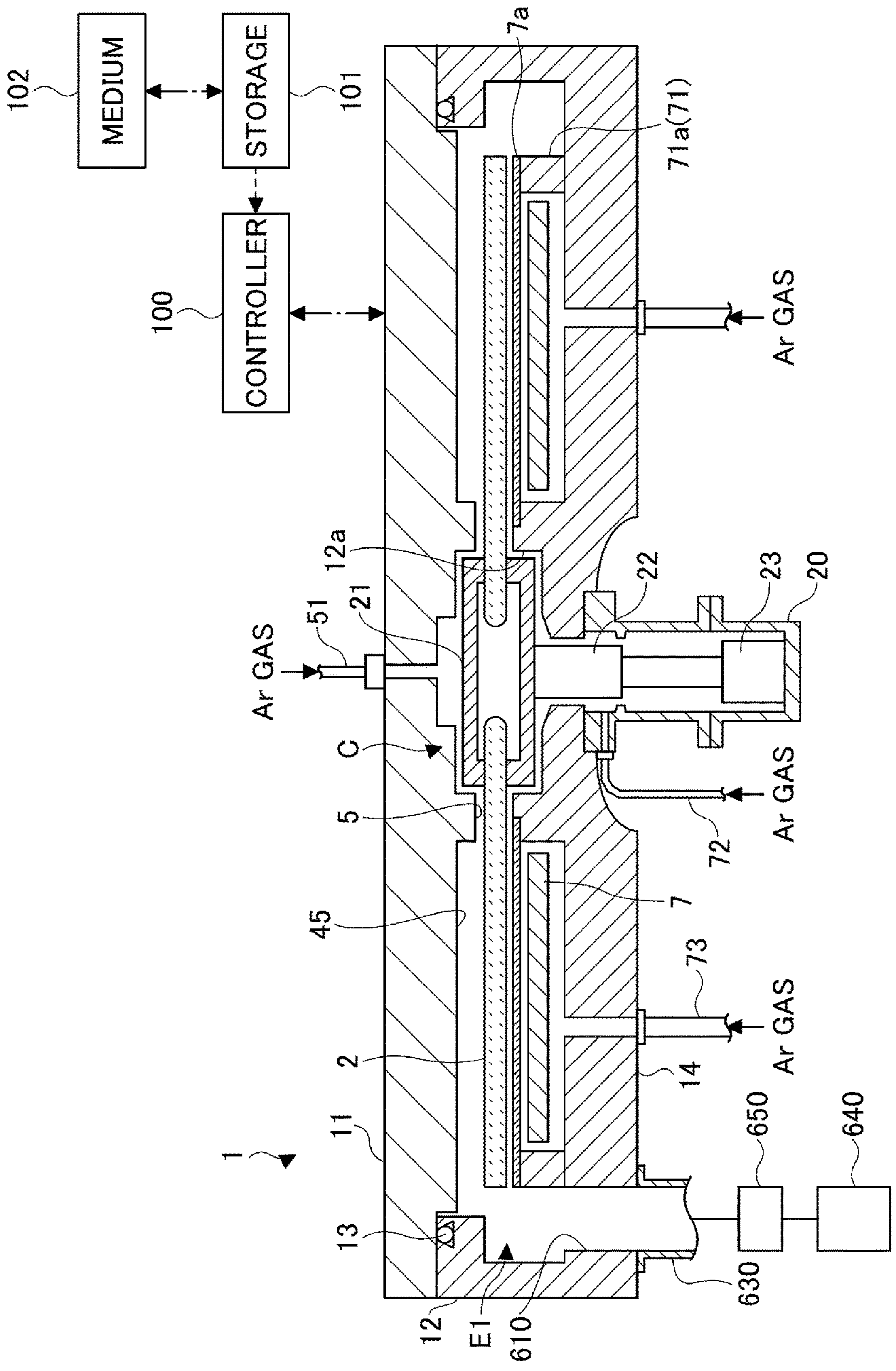
FIG. 1 is a schematic cross-sectional view illustrating a deposition apparatus according to an embodiment.

Hereinafter, non-limiting exemplary embodiments of the present disclosure will be described with reference to the accompanying drawings. In all accompanying drawings, the same or corresponding members or parts are denoted by the same or corresponding reference numerals, and overlapping descriptions are omitted.

[Deposition Apparatus]

Figure 2:
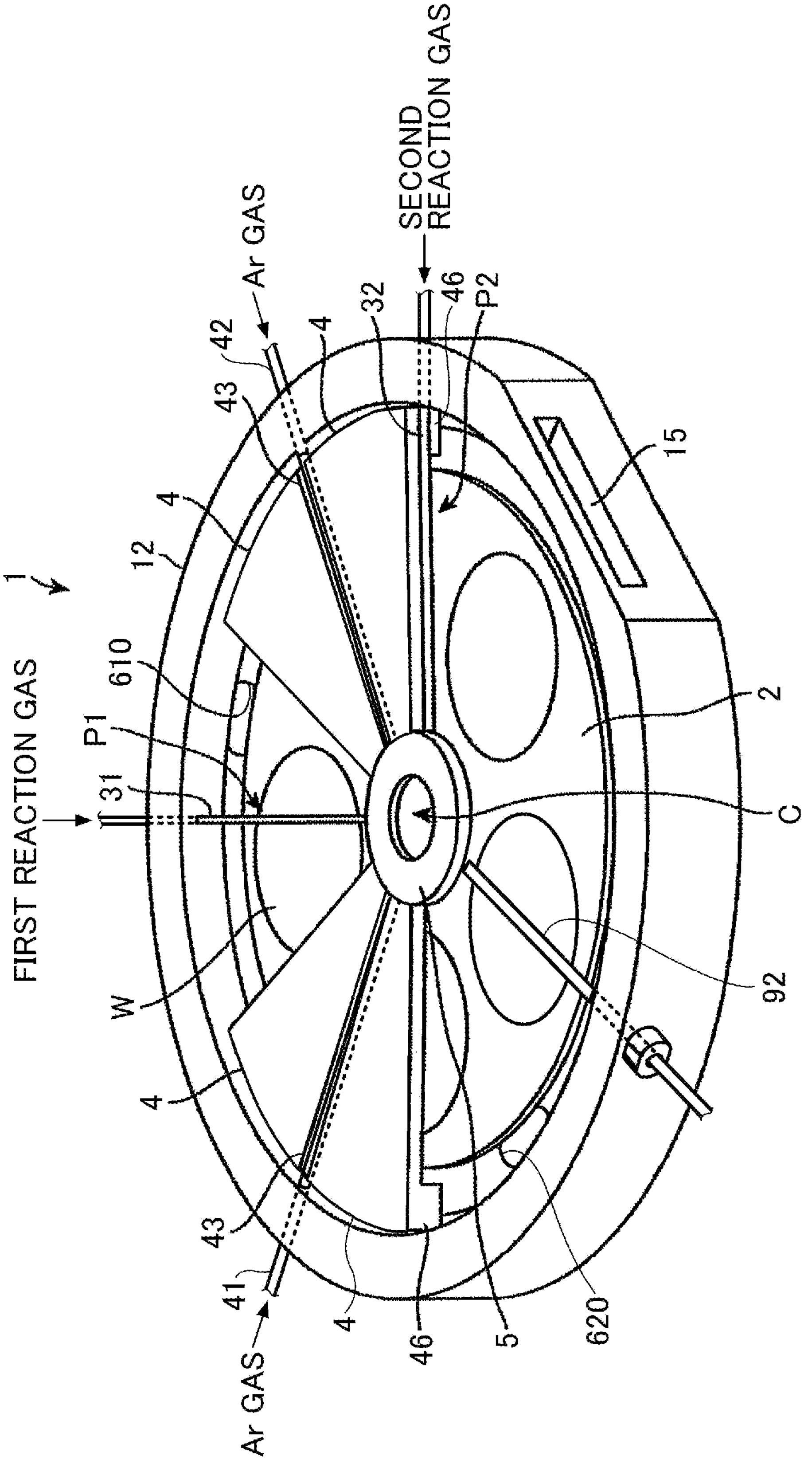
FIG. 2 is a schematic perspective view illustrating a configuration of the deposition apparatus of FIG. 1 in a vacuum chamber.
Figure 3:
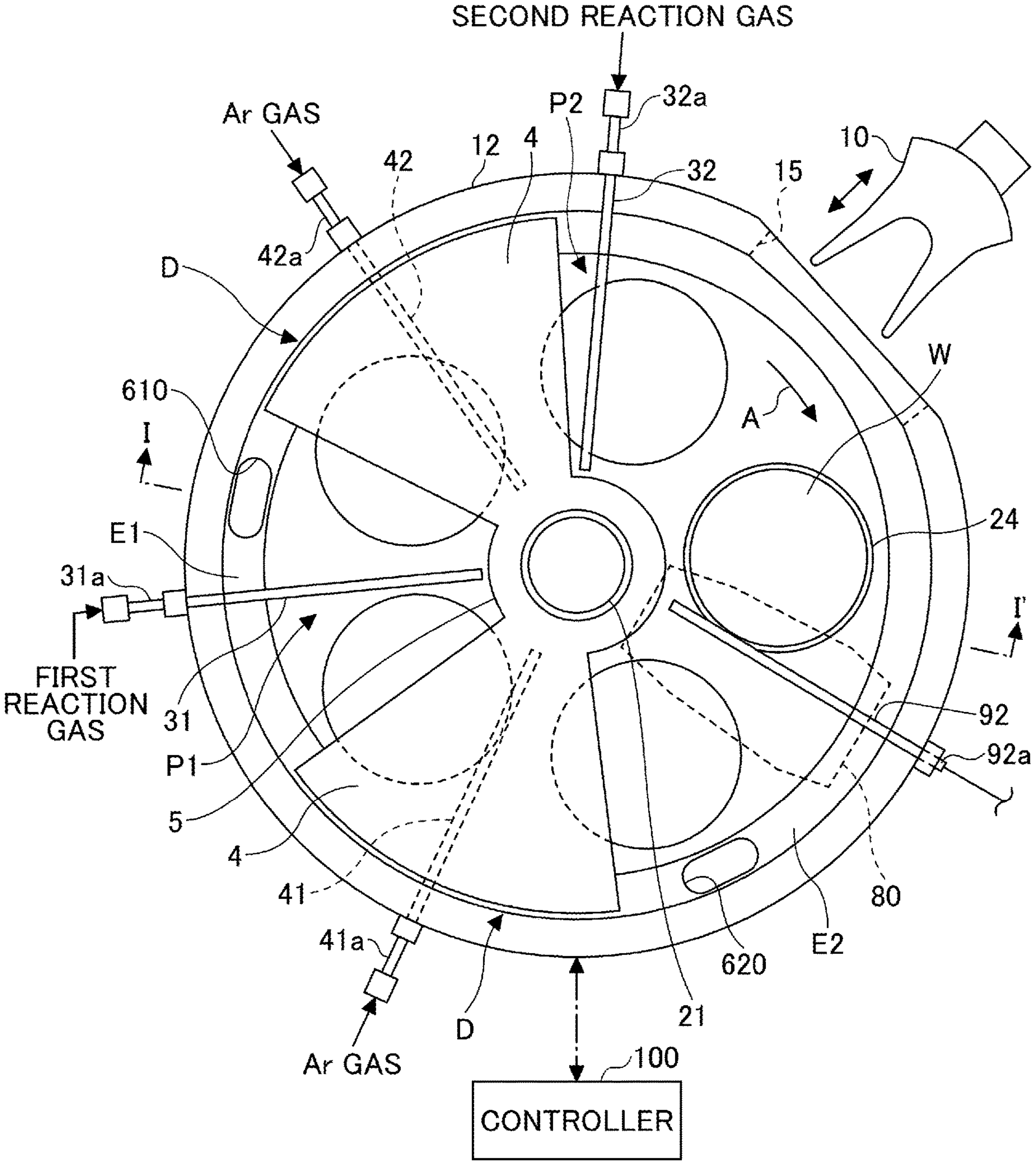
FIG. 3 is a schematic planar view illustrating a configuration of the deposition apparatus of FIG. 1 in the vacuum chamber.

A deposition apparatus suitable for performing a deposition method according to the embodiment will be described. Referring to FIGS. 1 to 3, the deposition apparatus includes a flat vacuum chamber 1 having a substantially circular planar shape, and a rotary table 2 provided in the vacuum chamber 1 and having a rotation center at the center of the vacuum chamber 1. The vacuum chamber 1 includes a chamber body 12 having a cylindrical shape with a bottom 14 and a top plate 11 that is hermetically detachably provided on the top surface of the chamber body 12 via a seal member 13 (FIG. 1) such as an O-ring, for example.

The rotary table 2 is fixed to a cylindrical core 21 at the center. The core 21 is fixed to the upper end of a rotating shaft 22 extending in the vertical direction. The rotating shaft 22 penetrates the bottom 14 of the vacuum chamber 1, and its lower end is attached to a driver 23 that rotates the rotating shaft 22 (FIG. 1) around a vertical axis. The rotating shaft 22 and the driver 23 are accommodated in a cylindrical case body 20 with an open top. The case body 20 is hermetically attached to the lower surface of the bottom 14 of the vacuum chamber 1 by a flange provided on its top surface, and the hermetic state between the internal and external atmospheres of the case body 20 is maintained.

On the surface of the rotary table 2, circular recesses 24 are provided for placing a plurality of substrates W (five in the illustrated example) along the rotation direction (circumferential direction) as illustrated in FIGS. 2 and 3. The substrates W may be, for example, a semiconductor wafer such as a silicon wafer. In FIG. 3, the substrate W is illustrated in only one recess 24 for convenience. The recess 24 has an inner diameter slightly larger than the diameter of the substrate W, for example, by 4 mm, and a depth approximately equal to the thickness of the substrate W. When the substrate W is accommodated in the recess 24, the surface of the substrate W and the surface of the rotary table 2 (the area where the substrate W is not placed) are at the same height. The bottom surface of the recess 24 is formed with through holes (none of which are illustrated) through which, for example, three lifting pins are penetrated for supporting the back surface of the substrate W and lifting the substrate W.

FIGS. 2 and 3 are diagrams for explaining the configuration in the vacuum chamber 1, and for convenience of explanation, the top plate 11 is omitted. As illustrated in FIGS. 2 and 3, a reaction gas nozzle 31, a reaction gas nozzle 32, separation gas nozzles 41 and 42, and a gas introduction nozzle 92 are spaced from each other along a circumferential direction of the vacuum chamber 1 above the rotary table 2. The reaction gas nozzle 31, the reaction gas nozzle 32, the separation gas nozzles 41 and 42, and the gas introduction nozzle 92 are examples of gas suppliers. In the illustrated example, the gas introduction nozzle 92, the separation gas nozzle 41, the reaction gas nozzle 31, the separation gas nozzle 42, and the reaction gas nozzle 32 are provided in this order clockwise (in the rotation direction of the rotary table 2) from a loading port 15 described later. The nozzles 92, 31, 32, 41, and 42 are made of quartz, for example. The nozzles 92, 31, 32, 41, and 42 are fixed to the outer circumferential wall of the chamber body 12 at gas introduction ports 92*a*, 31*a*, 32*a*, 41*a*, and 42*a* (FIG. 3), which are the proximal ends, respectively. Accordingly, the nozzles 92, 31, 32, 41, and 42 are introduced into the vacuum chamber 1 from the outer circumferential wall of the vacuum chamber 1, and are attached so as to extend horizontally against the rotary table 2 along the radial direction of the chamber body 12.

A plasma source 80 is provided above the gas introduction nozzle 92, as illustrated in simplified form by a dashed line in FIG. 3. The plasma source 80 will be described later.

The reaction gas nozzle 31 is connected to a first reaction gas supply source (not illustrated) via a pipe, a flow controller, and the like (not illustrated). The first reaction gas may be, for example, an aminosilane gas. Examples of the aminosilane gas include diisopropylaminosilane (DIPAS) and tris (dimethylamino) silane (3DMAS).

The reaction gas nozzle 32 is connected to a second reaction gas supply source (not illustrated) via a pipe, a flow controller, and the like (not illustrated). The second reaction gas may be, for example, an oxidation gas. The oxidation gas may be, for example, ozone gas ($O_3$).

Each of the separation gas nozzles 41 and 42 is connected to a source of separation gas (not illustrated) via a pipe, a flow control valve, and the like (not illustrated). The separation gas may be, for example, argon gas (Ar). The separation gas may be nitrogen gas ($N_2$).

A plurality of gas discharge holes 33 opening toward the rotary table 2 are provided in the reaction gas nozzles 31 and 32 at intervals of, for example, 10 mm along the length direction of the reaction gas nozzles 31 and 32. The region below the reaction gas nozzle 31 is a first processing region P1 for adsorbing a Si-containing gas to the substrate W. The region below the reaction gas nozzle 32 is a second processing region P2 for oxidizing the Si-containing gas adsorbed to the substrate W in the first processing region P1.

Referring to FIGS. 2 and 3, two projecting portions 4 are provided in the vacuum chamber 1. The projecting portions 4 together with the separation gas nozzles 41 and 42 constitute a separation region D. Thus, the projecting portions 4 are attached to the back surface of the top plate 11 so as to protrude toward the rotary table 2, as described later. Each of the projecting portions 4 has a fan shape in a planar view with the apex of the fan shape being cut in an arc shape. The projecting portions 4 are arranged such that, for example, an inner arc is connected to a protrusion 5 (described later), and an outer arc is positioned along the inner circumferential surface of the chamber body 12 of the vacuum chamber 1.

Figure 4:
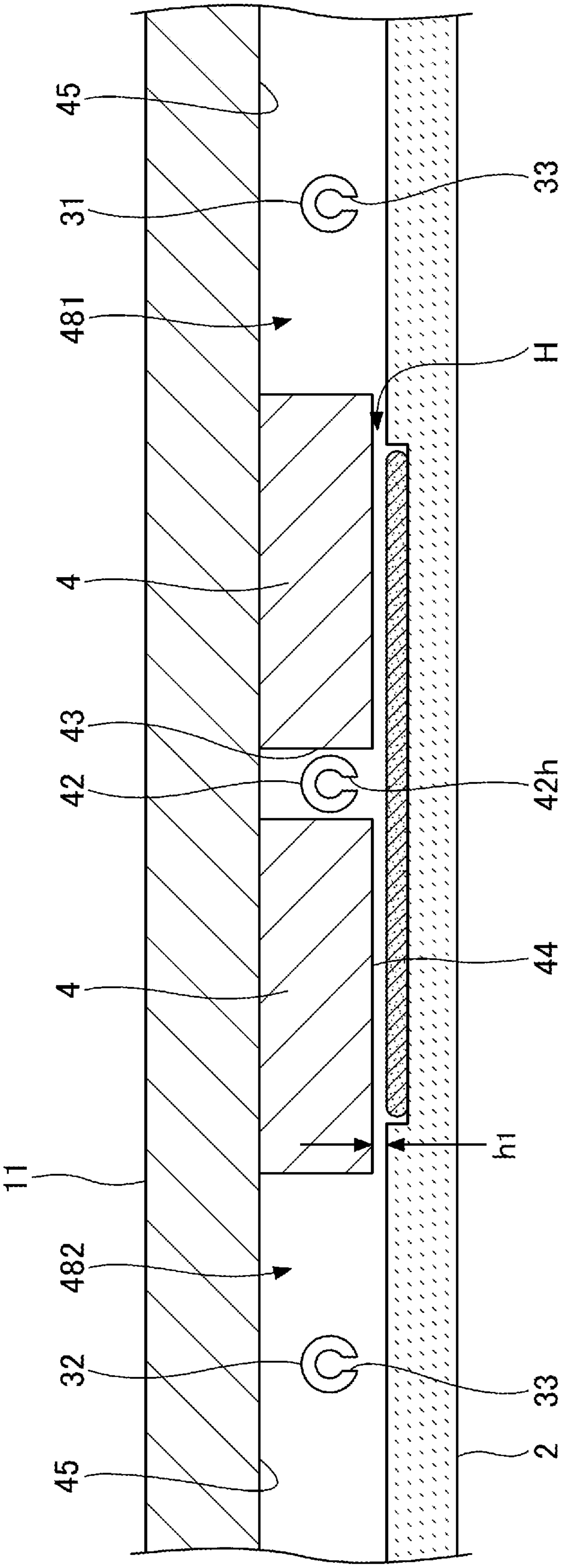
FIG. 4 is a schematic cross-sectional view illustrating the deposition apparatus of FIG. 1 along a concentric circle of a rotary table provided in the vacuum chamber.

FIG. 4 illustrates a cross section of the vacuum chamber 1 along the concentric circle of the rotary table 2 from the reaction gas nozzle 31 to the reaction gas nozzle 32. As illustrated in the figure, the projecting portion 4 is attached to the back surface of the top plate 11. Therefore, in the vacuum chamber 1, there are a flat low ceiling surface 44 (a first ceiling surface), which is the lower surface of the projecting portion 4, and a ceiling surface 45 (a second ceiling surface), which is higher than the ceiling surface and is 44 located on both circumferential sides of the ceiling surface 44. The ceiling surface 44 has a fan shape in a planar view with the apex of the fan shape being cut in an arc shape. As illustrated in the figure, a groove 43 is formed in the projecting portion 4 at the center of the circumferential direction so as to extend in the radial direction, and the separation gas nozzle 42 is accommodated in the groove 43. Another groove 43 is similarly formed in the other projecting portion 4, and the separation gas nozzle 41 is accommodated in the groove 43. The reaction gas nozzles 31 and 32 are respectively provided in spaces 481 and 482 below the higher ceiling surface 45. The reaction gas nozzles 31 and 32 are provided in the vicinity of the substrate W at a distance from the ceiling surface 45.

In the separation gas nozzles 41 and 42, a plurality of gas discharge holes 41*h* and 42*h* (see FIG. 4) opening toward the rotary table 2 are provided at an interval of, for example, 10 mm along the length direction of the separation gas nozzles 41 and 42.

The ceiling surface 44 forms a narrow space, a separation space H, with respect to the rotary table 2. When the separation gas is supplied from the gas discharge hole 42*h* of the separation gas nozzle 42, the separation gas flows through the separation space H toward the spaces 481 and 482. At this time, because the volume of the separation space H is smaller than the volumes of the spaces 481 and 482, the pressure in the separation space H can be made higher than the pressures in the spaces 481 and 482 by the separation gas. That is, the separation space H having a high pressure is formed between the spaces 481 and 482. The separation gas flowing out from the separation space H to the spaces 481 and 482 acts as a counter flow to the first reaction gas from the first processing region P1 and to the second reaction gas from the second processing region P2. Thereby, the first reaction gas from the first processing region P1 and the second reaction gas from the second processing region P2 are separated by the separation space H. This prevents the first reaction gas and the second reaction gas from mixing and reacting in the vacuum chamber 1.

The height h1 of the ceiling surface 44 with respect to the upper surface of the rotary table 2 is set to a height suitable for making the pressure in the separation space H higher than the pressures in the spaces 481 and 482, taking into consideration, for example, the pressure in the vacuum chamber 1 during deposition, the rotation speed of the rotary table 2, the amount of the separation gas to be supplied, and the like.

A protrusion 5 (FIGS. 2 and 3) surrounding the outer periphery of the core 21 that fixes the rotary table 2, is provided on the lower surface of the top plate 11. The protrusion 5 is, for example, continuous with the portion on the rotation center side of the projecting portion 4, and its lower surface is formed at the same height as the ceiling surface 44.

Figure 5:
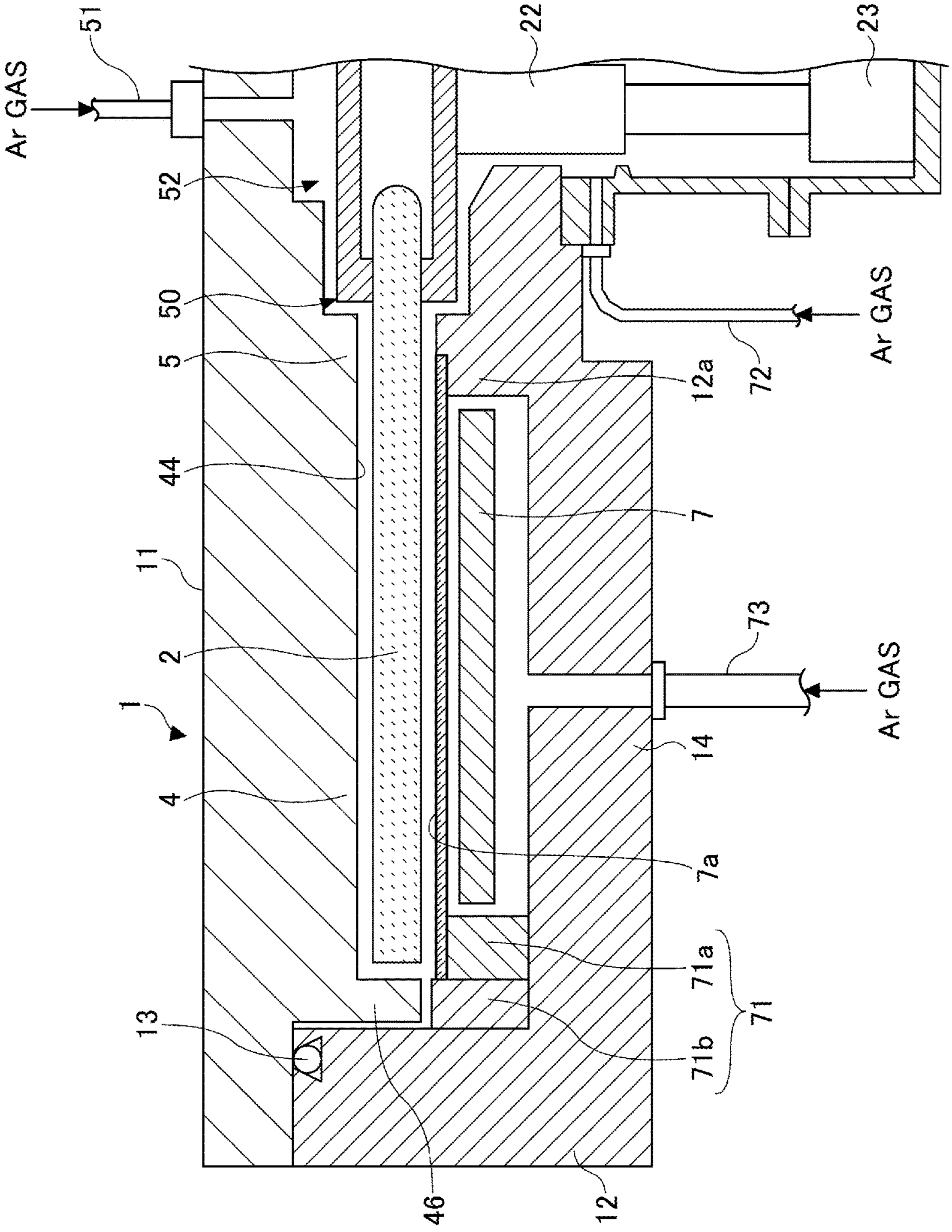
FIG. 5 is another schematic cross-sectional view illustrating the deposition apparatus of FIG. 1.

FIG. 1, referred to above, is a cross-sectional view along the I-I' line of FIG. 3, illustrating the region where the ceiling surface 45 is provided. FIG. 5 is a cross-sectional view illustrating the region where the ceiling surface 44 is provided. As illustrated in FIG. 5, a bend 46 that bends in an L-shape so as to face the outer end surface of the rotary table 2 is formed on the peripheral edge of the fan-shaped projecting portion 4 (the part on the outer edge of the vacuum chamber 1). Similar to the projecting portion 4, the bend 46 prevents the reaction gas from entering from both sides of the separation region D and reduces mixing of both reaction gases. The fan-shaped projecting portion 4 is provided on the top plate 11 and the top plate 11 can be removed from the chamber body 12. Therefore, there is a slight gap between the outer peripheral surface of the bend 46 and the chamber body 12. The gap between the inner peripheral surface of the bend 46 and the outer peripheral surface of the rotary table 2, and the gap between the outer peripheral surface of the bend 46 and the chamber body 12 are set to the same dimensions as, for example, the height of the ceiling surface 44 relative to the upper surface of the rotary table 2.

The inner peripheral wall of the chamber body 12 in the separation region D is formed in a vertical plane close to the outer peripheral surface of the bend 46 as illustrated in FIG. 4. The inner peripheral wall of the chamber body 12 in the regions other than the separation region D is recessed outward, for example, from the part opposite to the outer end surface of the rotary table 2 to the bottom 14 as illustrated in FIG. 1. Hereinafter, for convenience of explanation, the recessed area having a generally rectangular cross-sectional shape is referred to as an exhaust region. Specifically, the exhaust region communicating with the first processing region P1 is referred to as a first exhaust region E1, and the region communicating with the second processing region P2 is referred to as a second exhaust region E2. A first exhaust port 610 and a second exhaust port 620 are formed at the bottom of the first exhaust region E1 and the second exhaust region E2, respectively, as illustrated in FIGS. 1 to 3. The first exhaust port 610 and the second exhaust port 620 are each connected to a vacuum pump 640 via an exhaust pipe 630 as illustrated in FIG. 1. The exhaust pipe 630 is provided with a pressure controller 650.

A heater unit 7 is provided in the space between the rotary table 2 and the bottom 14 of the vacuum chamber 1, as illustrated in FIGS. 1 and 5. The heater unit 7 heats the substrate W on the rotary table 2 via the rotary table 2 to the temperature determined in the process recipe (for example, 450° C.). A ring-shaped cover member 71 is provided below the vicinity of the periphery of the rotary table 2 (FIG. 5). The cover member 71 divides the atmosphere from the upper space of the rotary table 2 to the exhaust regions E1 and E2 and the atmosphere in which the heater unit 7 is placed, to prevent gas from entering the region below the rotary table 2. The cover member 71 includes an inner member 71*a* provided so as to face from below the outer edge of the rotary table 2 and the outer circumference of the outer edge, and an outer member 71*b* provided between the inner member 71*a* and the inner wall surface of the vacuum chamber 1. The outer member 71*b* is provided close to the bend 46 below the bend 46 formed at the outer edge of the projecting portion 4 in the separation region D. The inner member 71*a* surrounds the heater unit 7 all over its circumference below the outer edge of the rotary table 2 (and below the area slightly outside the outer edge).

The part of the bottom 14 that is closer to the rotation center than the space where the heater unit 7 is placed projects upward to approach the core 21 near the center of the lower surface of the rotary table 2, forming a protrusion 12*a*. The space between the protrusion 12*a* and the core 21 is narrow, and the gap between the inner peripheral surface of the through hole of the rotating shaft 22 penetrating the bottom 14 and the rotating shaft 22 is narrow, and these narrow spaces communicate with the case body 20. The case body 20 is provided with a purge gas supply pipe 72 for purging the purge gas by supplying it into the narrow spaces. The purge gas may be, for example, argon gas. The purge gas may be nitrogen gas. The bottom 14 of the vacuum chamber 1 is provided with a plurality of purge gas supply pipes 73 for purging the space where the heater unit 7 is placed, at predetermined angular intervals in the circumferential direction below the heater unit 7. FIG. 5 illustrates one purge gas supply pipe 73. Between the heater unit 7 and the rotary table 2, a lid member 7*a* is provided to circumferentially cover the space between the inner peripheral wall of the outer member 71*b* (the upper surface of the inner member 71*a*) and the upper end of the protrusion 12*a* in order to prevent the gas from entering into the region where the heater unit 7 is provided. The lid member 7*a* is formed of, for example, quartz.

A separation gas supply pipe 51 is connected to the center of the top plate 11 of the vacuum chamber 1. The separation gas supply pipe 51 supplies the separation gas to a space 52 between the top plate 11 and the core 21. The separation gas supplied to the space 52 is discharged toward the periphery along the surface of the side of the substrate placement area of the rotary table 2, through a narrow gap 50 between the protrusion 5 and the rotary table 2. The gap 50 can be maintained at a higher pressure than the spaces 481 and 482 by the separation gas. Therefore, the gap 50 prevents mixing of the first reaction gas supplied to the first processing region P1 and the second reaction gas supplied to the second processing region P2, through a central region C. That is, the gap 50 (or the center region C) functions similarly to the separation space H (or the separation region D).

On the sidewall of the vacuum chamber 1, as illustrated in FIGS. 2 and 3, a loading port 15 is formed to transfer the substrate W between the external transfer arm 10 and the rotary table 2. The loading port 15 is opened and closed by a gate valve (not illustrated). The substrate W is transferred to/from the transfer arm 10 at a position facing the loading port 15. Below the rotary table 2, at a position corresponding to the transfer position, a lifting pin for lifting the substrate W from the back surface through the recess 24 when transferring and its lifting mechanism are provided (not illustrated).

Figure 6:
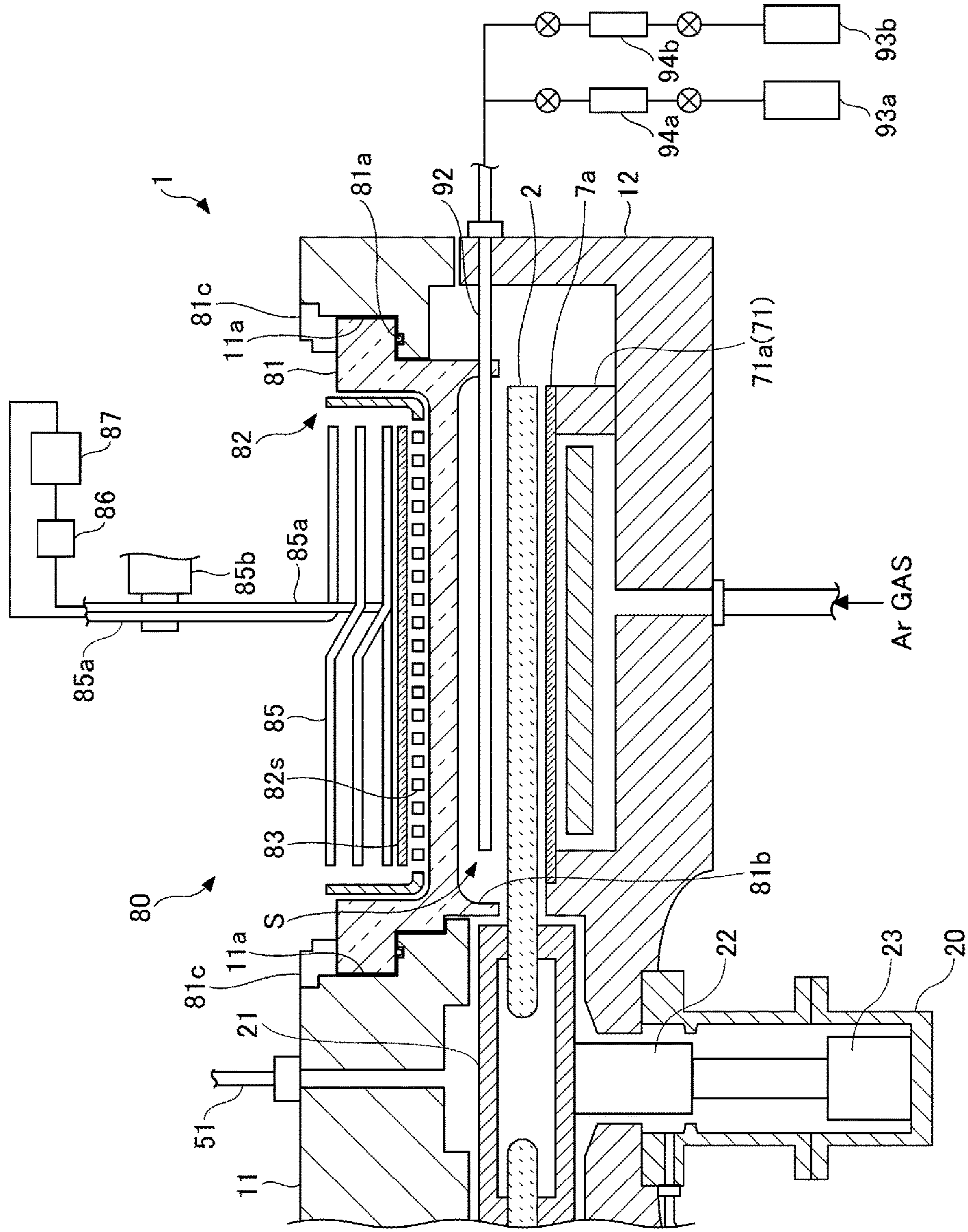
FIG. 6 is a schematic cross-sectional view illustrating a plasma source provided in the deposition apparatus of FIG. 1.
Figure 7:
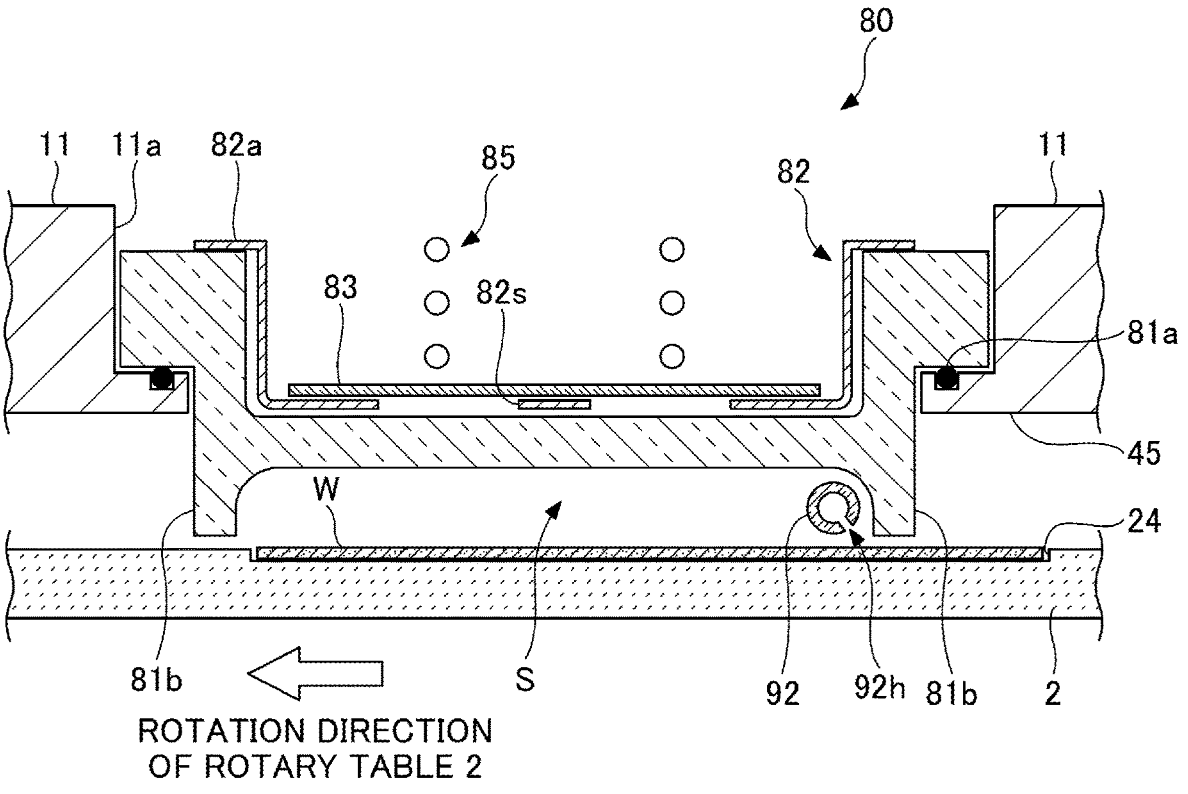
FIG. 7 is another schematic cross-sectional view illustrating the plasma source provided in the deposition apparatus of FIG. 1.
Figure 8:
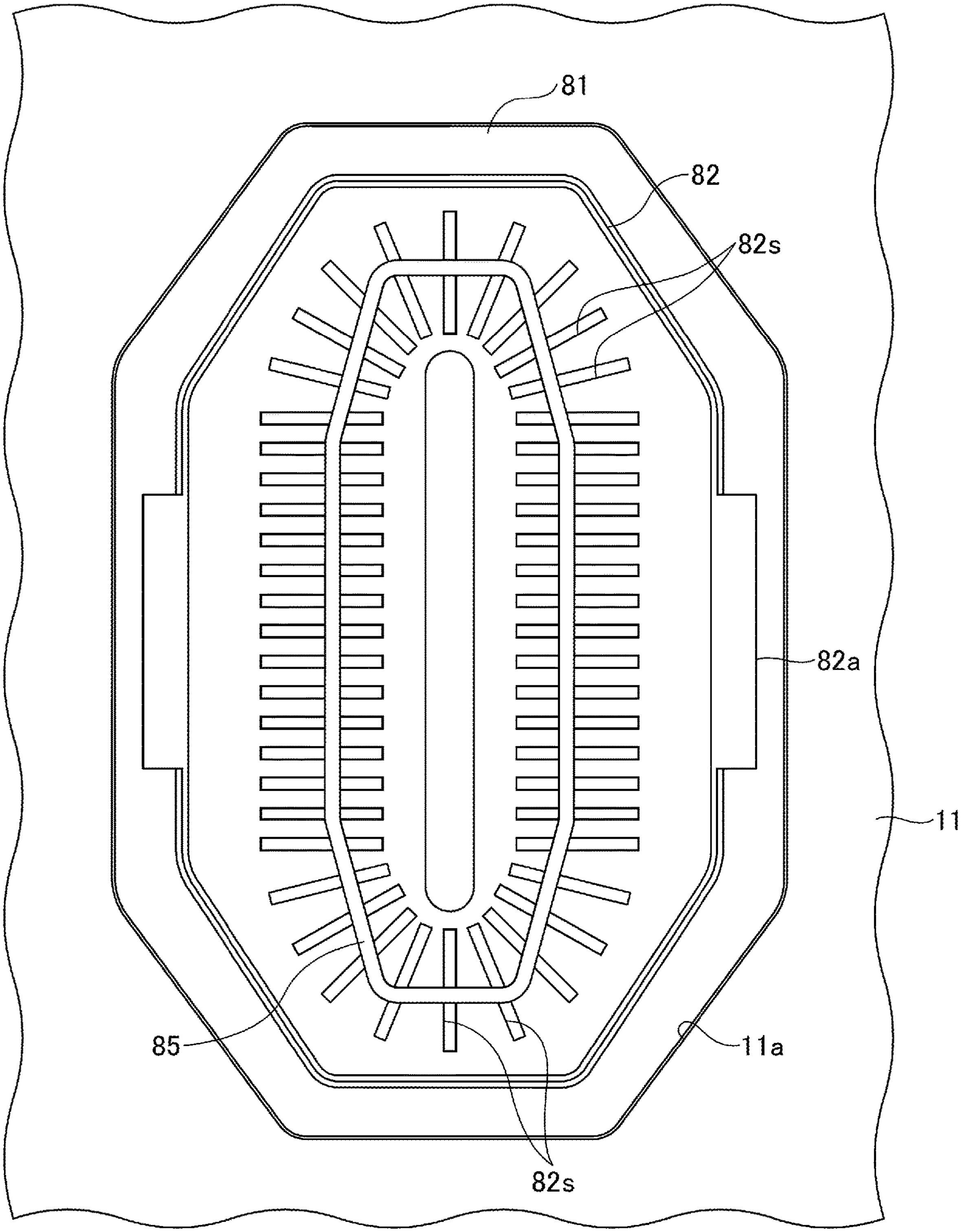
FIG. 8 is a schematic top view illustrating the plasma source provided in the deposition apparatus of FIG. 1.

The plasma source 80 will be described with reference to FIGS. 6 to 8. FIG. 6 is a schematic cross-sectional view of the plasma source 80 along the radial direction of the rotary table 2. FIG. 7 is a schematic cross-sectional view of the plasma source 80 along a direction orthogonal to the radial direction of the rotary table 2. FIG. 8 is a schematic top view illustrating the plasma source 80. For the convenience of illustration, some members are simplified in these figures.

Referring to FIG. 6, the plasma source 80 includes a frame member 81, a Faraday shielding plate 82, an insulating plate 83, and an antenna 85. The frame member 81 is formed using a high-frequency permeable material. The frame member 81 has a recess recessed from the upper surface and is fitted into an opening 11*a* formed in the top plate 11. The Faraday shielding plate 82 is accommodated in the recess of the frame member 81 and has a substantially box shape with an open top. The insulating plate 83 is arranged on the bottom surface of the Faraday shielding plate 82. The antenna 85 is supported above the insulating plate 83. The antenna 85 has a coil shape with a substantially octagonal top face shape.

The opening 11*a* of the top plate 11 has a plurality steps. A groove is formed around the entire circumference of one of the plurality of steps. A seal member 81*a*, such as an O-ring, is fitted into the groove. The frame member 81 has a plurality of steps corresponding to the steps of the opening 11*a*. When the frame member 81 is fitted into the opening 11*a*, the lower surface of one of the plurality of the steps comes into contact with the seal member 81*a* fitted into the groove of the opening 11*a*. Thus, airtightness between the top plate 11 and the frame member 81 is maintained. As illustrated in FIG. 6, a pressing member 81*c* is provided along the outer periphery of the frame member 81 fitted into the opening 11*a* of the top plate 11, whereby the frame member 81 is pressed downward against the top plate 11. Thus, airtightness between the top plate 11 and the frame member 81 is more reliably maintained.

The lower surface of the frame member 81 faces the rotary table 2 in the vacuum chamber 1, and a projection 81*b* that projects downward (toward the rotary table 2) is provided on the entire outer periphery of the lower surface. The lower surface of the projection 81*b* is close to the surface of the rotary table 2. A space (hereinafter referred to as an internal space S) is defined above the rotary table 2 by the projection 81*b*, the surface of the rotary table 2, and the lower surface of the frame member 81. The distance between the lower surface of the projection 81*b* and the surface of the rotary table 2 may be approximately the same as the height h1 of the top plate 11 relative to the upper surface of the rotary table 2 in the separation space H (FIG. 4).

A gas introduction nozzle 92 penetrating the projection 81*b* extends into the internal space S. As illustrated in FIG. 6, for example, a supply source 93*a* filled with a noble gas and a supply source 93*b* filled with a modifying gas are connected to the gas introduction nozzle 92. The noble gas may be, for example, argon gas. The modifying gas may be, for example, ammonia gas ($NH_3$). From the supply sources 93*a* and 93*b*, the noble gas and the modifying gas, whose flow rates are controlled by the corresponding flow rate controllers 94*a* and 94*b*, are supplied into the internal space S at a predetermined flow ratio (mixing ratio).

A plurality of discharge holes 92*h* are formed in the gas introduction nozzle 92 at predetermined intervals (for example, 10 mm) along its longitudinal direction, and the noble gas and the modifying gas as described above are discharged from the discharge holes 92*h*. As illustrated in FIG. 7, the discharge holes 92*h* are inclined from the direction perpendicular to the rotary table 2 toward upstream in the rotation direction of the rotary table 2. Therefore, the gas supplied from the gas s introduction nozzle 92 is discharged in the direction opposite to the rotation direction of the rotary table 2, specifically, toward the gap between the lower surface of the projection 81*b* and the surface of the rotary table 2. This prevents the reaction gas and the separation gas from flowing into the internal space S from the space below the ceiling surface 45, which is located upstream of the plasma source 80 along the rotation direction of the rotary table 2. As described above, the projection 81*b* formed along the outer periphery of the lower surface of the frame member 81 is close to the surface of the rotary table 2. Therefore, the pressure in the internal space S can be easily maintained at high level by the gas from the gas introduction nozzle 92. This also prevents the reaction gas and the separation gas from flowing into the internal space S.

The Faraday shielding plate 82 is made of a conductive material such as metal, and is grounded, which is not shown in the figure. As illustrated in FIG. 8, a plurality of slits 82*s* are formed at the bottom of the Faraday shielding plate 82. Each slit 82*s* extends substantially orthogonally to the corresponding side of the antenna 85 having a substantially octagonal planar shape.

As illustrated in FIGS. 7 and 8, the Faraday shielding plate 82 includes, at two locations at the top end, supports 82*a* that bend outward. The support 82*a* is supported on the top surface of the frame member 81, so that the Faraday shielding plate 82 is supported at a predetermined position within the frame member 81.

The insulating plate 83 is formed of, for example, quartz glass. The insulating plate 83 has a size slightly smaller than the bottom surface of the Faraday shielding plate 82 and is placed on the bottom surface of the Faraday shielding plate 82. The insulating plate 83 insulates the Faraday shielding plate 82 and the antenna 85. The insulating plate 83 transmits the high-frequency waves radiated from the antenna 85 downward.

The antenna 85 is formed by winding a copper hollow tube (pipe), for example, three times, such that the planar shape is substantially octagonal. Cooling water can be circulated in the pipe, which prevents the antenna 85 from being heated to a high temperature by the high frequency supplied to the antenna 85. The antenna 85 includes a stand 85*a*. A support 85*b* is attached to the stand 85*a*. By the support 85*b*, the antenna 85 is maintained at a predetermined position within the Faraday shielding plate 82. A high-frequency power supply 87 is connected to the support 85*b* via a matching box 86. The high-frequency power supply 87 generates a high frequency having a frequency of, for example, 13.56 MHZ.

According to the plasma source 80 having the above configuration, when high frequency power is supplied to the antenna 85 from the high-frequency power supply 87 via the matching box 86, an electromagnetic field is generated by the antenna 85. The electric field component of the electromagnetic field is shielded by the Faraday shielding plate 82 and does not propagate downward. In contrast, the magnetic field component propagates into the internal space S through a plurality of slits 82*s* of the Faraday shielding plate 82. Due to the magnetic field component, plasma is generated from the noble gas and the modifying gas supplied from the gas introduction nozzle 92 to the internal space S at a predetermined flow ratio (mixing ratio).

The deposition apparatus is provided with a controller 100 consisting of a computer for controlling the operation of the entire apparatus as illustrated in FIG. 1. In the memory of the controller 100, a program is stored to cause the deposition apparatus to perform the deposition method described later, under the control of the controller 100. The program has a group of steps to perform the deposition method described later. The program is stored in a medium 102 such as a hard disk, a compact disk, a magneto-optical disk, a memory card, a flexible disk, and the like, and is read into a storage 101 by a predetermined reader and installed in the controller 100.

[Deposition Method]

Figure 9:
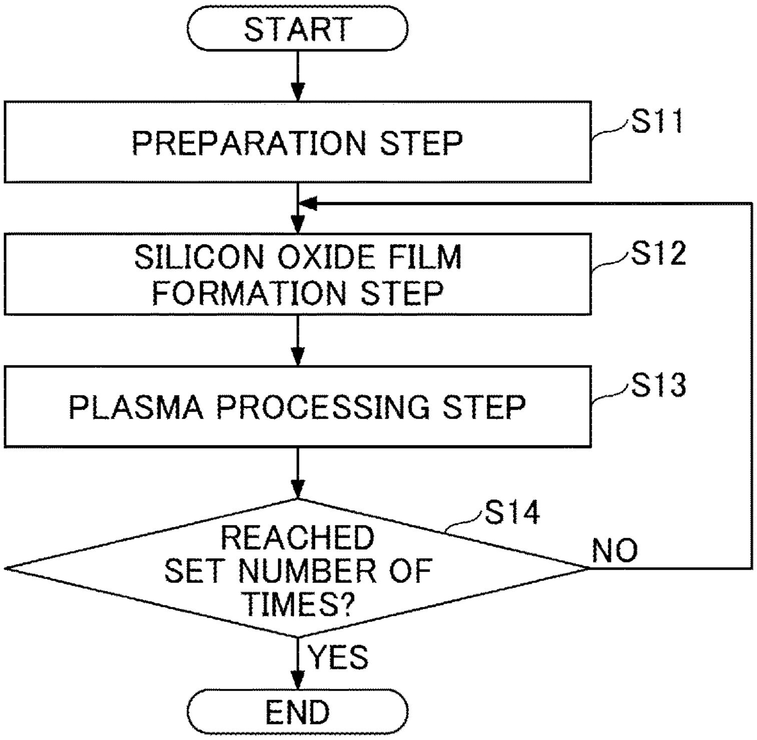
FIG. 9 is a flowchart illustrating an example of a deposition method according to an embodiment.
Figure 10:
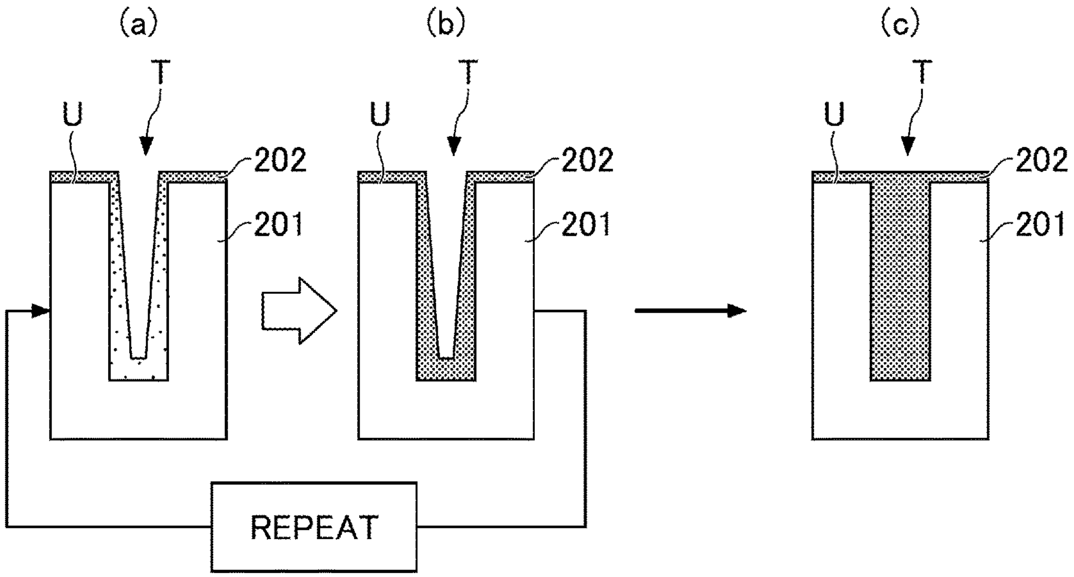
FIG. 10 is a schematic cross-sectional view illustrating an example of the deposition method according to an embodiment.

Referring to FIGS. 9 and 10, the deposition method according to the embodiment will be described with reference to a case where the deposition method is performed using the deposition apparatus described above. FIG. 9 is a flowchart illustrating an example of the deposition method according to the embodiment. FIG. 10 is a schematic cross-sectional view illustrating an example of the deposition method according to the embodiment. Hereinafter, a case in which aminosilane gas is used as the first reaction gas, oxidation gas is used as the second reaction gas, argon gas is used as the noble gas, ammonia gas is used as the modifying gas, and argon gas is used as the separation gas and the purge gas will be described.

As illustrated in FIG. 9, the deposition method according to the embodiment includes a preparation step S11, a silicon oxide film formation step S12, a plasma processing step S13, and a determination step S14.

The preparation step S11 includes preparing a substrate 201 having a recess T on a surface U. The substrate 201 is, for example, a silicon wafer. The recess T is, for example, a trench. The recess T may be a hole.

The silicon oxide film formation step S12 is performed after the preparation step S11. The silicon oxide film formation step S12 includes depositing a film of a reaction product of aminosilane gas and oxidation gas in the recess T.

In the silicon oxide film formation step S12, a gate valve (not illustrated) is first opened, and the substrate 201 is transferred to the recess 24 of the rotary table 2 through the loading port 15 (FIGS. 2 and 3) by the transfer arm 10 (FIG. 3) from the outside. The transfer of the substrate 201 is performed by elevating and lowering a lifting pin (not illustrated) from the bottom side of the vacuum chamber 1 through a through hole in the bottom surface of the recess 24 when the recess 24 is stopped at a position across from the loading port 15. The transfer of the substrate 201 is performed by intermittently rotating the rotary table 2. The substrates 201 are respectively placed in the five recesses 24 of the rotary table 2.

Subsequently, the gate valve is closed, and the inside of the vacuum chamber 1 is evacuated to the attainable vacuum degree by the vacuum pump 640. Subsequently, argon gas is discharged at a predetermined flow rate from the separation gas nozzles 41 and 42, and argon gas is discharged at a predetermined flow rate from the separation gas supply pipe 51 and from the purge gas supply pipes 72 and 72. Accordingly, the inside of the vacuum chamber 1 is controlled to a predetermined first pressure by the pressure controller 650 (FIG. 1). Then, the substrate 201 is heated to a first temperature by the heater unit 7 while the rotary table 2 is rotated clockwise at a first rotation speed. The first rotation speed is, for example, 20 rpm. The first temperature is, for example, 450° C.

Thereafter, the aminosilane gas is supplied from the reaction gas nozzle 31 (FIGS. 2 and 3), and the oxidation gas is supplied from the reaction gas nozzle 32. A gas mixture of argon gas and $NH_3$ gas (hereinafter referred to as "Ar/$NH_3$ gas") is supplied from the gas introduction nozzle 92, and a high frequency having a frequency of 13.56 MHz is supplied to the antenna 85 of the plasma source 80 with a power of, for example, 1400 W. As a result, a plasma is generated from the Ar/$NH_3$ gas in the internal space S between the plasma source 80 (FIG. 6) and the rotary table 2. Hereinafter, the plasma generated from the Ar/$NH_3$ gas is referred to as an Ar/$NH_3$ plasma.

By rotation of the rotary table 2, the substrate 201 passes through the first processing region P1, the separation region D, the second processing region P2, the region below the internal space S, and the separation region D, repeatedly in this order (see FIG. 3). In the first processing region P1, molecules of aminosilane gas are adsorbed on the surface U of the substrate 201 and on the inner surface of the recess and T, a molecular layer of organoaminosilane is formed. After passing through the separation region D, in the second processing region P2, the aminosilane gas adsorbed on the surface U of the substrate 201 and on the inner surface of the recess T is oxidized by molecules of the oxidation gas, and a silicon oxide film is formed along the inner surface of the recess T. When the aminosilane gas is oxidized, hydroxyl groups (OH groups) are generated as by-products, and the generated hydroxyl groups are adsorbed on the surface.

Then, when the substrate 201 reaches the internal space S of the plasma source 80, the substrate 201 is exposed to the Ar/$NH_3$ plasma. At this time, a part of the hydroxyl groups adsorbed on the silicon oxide film is desorbed from the silicon oxide film by collision of, for example, high-energy particles in the Ar/$NH_3$ plasma, and amino groups ($NH_2$ groups) are generated on the surface. The Ar/$NH_3$ plasma reaches the surface U of the substrate 201 and the opening of the recess T, but hardly reaches the bottom of the recess T and the side surface near the bottom. Therefore, a relatively large amount of hydroxyl groups is desorbed from the surface U of the substrate 201 and from the side surface near the opening of the recess T. As a result, the hydroxyl groups are distributed such that the density of the hydroxyl groups is high at the bottom of the recess T and the side surface near the bottom, and the density becomes low toward the opening of the recess T and the surface U of the substrate 201.

In addition, a part of the silicon oxide film is modified into a film having high etching resistance by, for example, collision of high-energy particles in the Ar/$NH_3$ plasma. The Ar/$NH_3$ plasma reaches the surface U of the substrate 201 and near the opening of the recess T, but hardly reaches the bottom and the side surface near the bottom of the recess T. Therefore, the silicon oxide film formed on the surface U of the substrate 201 and the side surface near the opening of the recess T is easily modified into a film having high etching resistance. In contrast, the silicon oxide film formed on the bottom and the side surface near the bottom of the recess T is not easily modified into a film having high etching resistance. As a result, the film quality may vary in the depth direction of the recess T.

Next, when the substrate 201 reaches the first processing region P1 again by rotation of the rotary table 2, molecules of aminosilane gas supplied from the reaction gas nozzle 31 are adsorbed on the surface U of the substrate 201 and the inner surface of the recess T. At this time, molecules of aminosilane gas are easily adsorbed by hydroxyl groups, and they are adsorbed on the surface U of the substrate 201 and on the inner surface of the recess T in a distribution according to the distribution of the hydroxyl groups. That is, molecules of aminosilane gas are adsorbed on the inner surface of the recess T such that the density is high at the bottom and the side surface near the bottom of the recess T, and the density becomes low toward the opening of the recess T.

Subsequently, when the substrate 201 passes through the second processing region P2, the aminosilane gas adsorbed on the surface U of the substrate 201 and on the inner surface of the recess T is oxidized by the oxidation gas, and a silicon oxide film is further formed. The thickness distribution of the silicon oxide film reflects the density of the aminosilane gas adsorbed on the inner surface of the recess T. That is, the silicon oxide film thickens at the bottom and the side surface near the bottom of the recess T, and thins toward the opening of the recess T. The hydroxyl groups generated by the oxidation of the aminosilane gas are adsorbed on the surface of the silicon oxide film.

Then, when the substrate 201 reaches the internal space S of the plasma source 80 again, the hydroxyl groups are distributed such that the density of the hydroxyl groups is high at the bottom and the side surface near the bottom of the recess T, and the density becomes low toward the opening of the recess T, as described above.

Thereafter, when the above processes are repeated, as illustrated in FIG. 10(*a*), a silicon oxide film 202 with a thickness increasing from the opening toward the bottom of the recess T is formed. As described above, the silicon oxide film 202 may be a film whose film quality decreases from the opening toward the bottom of the recess T.

In the silicon oxide film formation step S12, it is preferable to stop depositing the silicon oxide film before the thickness of the silicon oxide film 202 in the thickest part (for example, the bottom of the recess T) exceeds a predetermined thickness. The predetermined thickness may be, for example, less than or equal to the thickness at which the silicon oxide film 202 is modified throughout the film thickness direction in the plasma processing step S13 described later.

At the end of the silicon oxide film formation step S12, for example, the supply of the aminosilane gas from the reaction gas nozzle 31 is stopped, the supply of the oxidation gas from the reaction gas nozzle 32 is stopped, and the supply of the Ar/$NH_3$ gas from the gas introduction nozzle 92 is stopped. The power supplied to the antenna 85 of the plasma source 80 is stopped.

The plasma processing step S13 is performed after the silicon oxide film formation step S12. The plasma processing step S13 includes exposing the substrate to a plasma generated from argon gas to adsorb hydroxyl groups on the inner surface of the recess in a predetermined distribution.

In the plasma processing step S13, the pressure controller 650 (FIG. 1) controls the inside of the vacuum chamber 1 to a predetermined second pressure. The second pressure is, for example, lower than the first pressure. In this case, the silicon oxide film 202 formed at the bottom of the recess T is easily modified into a film having high etching resistance. The second pressure may be the same as the first pressure. In this case, the step of changing the pressure in the vacuum chamber 1 when the process proceeds to the plasma processing step S13 can be omitted, thereby improving productivity. Then, the substrate 201 is heated to a second temperature by the heater unit 7 while rotating the rotary table 2 clockwise at a second rotation speed. The second rotation speed may be, for example, the same rotation speed as the first rotation speed. The second rotation speed may be a rotation speed different from the first rotation speed. The second temperature may be, for example, the same temperature as the first temperature. In this case, the step of changing the temperature in the vacuum chamber 1 when the process proceeds to the plasma processing step S13 can be omitted, thereby improving productivity. The second temperature may be a temperature different from the first temperature.

Thereafter, argon gas is supplied from the gas introduction nozzle 92, and a high frequency having a frequency of 13.56 MHz is supplied to the antenna 85 of the plasma source 80 with a power of, for example, 1400 W. As a result, a plasma is generated from the argon gas in the internal space S between the plasma source 80 (FIG. 6) and the rotary table 2. Hereinafter, the plasma generated from the argon gas is referred to as an Ar plasma.

By rotation of the rotary table 2, the substrate 201 passes through the first processing region P1, the separation region D, the second processing region P2, the region below the internal space S, and the separation region D, repeatedly in this order (see FIG. 3). By exposing the substrate 201 to the Ar plasma in the internal space S of the plasma source 80, the silicon oxide film is modified into a film having high etching resistance. At this time, conditions are set such that the Ar plasma reaches the bottom and the side surface near the bottom of the recess T. Thus, the silicon oxide film formed on the bottom and the side surface near the bottom of the recess T, which is hard to be modified in the silicon oxide film formation step S12, is modified into a film having high etching resistance. As a result, as illustrated in FIG. 10(*b*), the variation of the film quality in the depth direction of the recess T is reduced.

At the end of the plasma processing step S13, for example, the supply of the argon gas from the gas introduction nozzle 92 is stopped, and the power supplied to the antenna 85 of the plasma source 80 is stopped.

The determination step S14 is performed after the plasma processing step S13. The determination step S14 includes determining whether or not the steps from the silicon oxide film formation step S12 to the plasma processing step S13 have been performed a set number of times. When the set number of times has not been reached (NO in the determination step S14), the steps from the silicon oxide film formation step S12 to the plasma processing step S13 are performed again. When the set number of times has been reached (YES in the determination step S14), the processing is terminated. Thus, by repeating the process of performing the steps from the silicon oxide film formation step S12 to the plasma processing step S13 in this order a plurality of times until the set number of times has been reached, the recess T is embedded with the silicon oxide film 202 as illustrated in FIG. 10(*c*).

According to the deposition method according to the embodiment, the hydroxyl groups generated by the oxidation of the aminosilane gas and adsorbed on the silicon oxide film are distributed such that the density is high at the bottom and the side surface near the bottom of the recess T by the Ar/$NH_3$ plasma, and the density becomes low toward the opening of the recess T. The hydroxyl groups act as adsorption sites for the aminosilane gas, and the aminosilane gas is adsorbed according to the distribution of the hydroxyl groups. Therefore, the aminosilane gas is also distributed such that the density is high at the bottom and the side surface near the bottom of the recess T, and the density becomes low toward the opening of the recess T. Therefore, the silicon oxide film is deposited such that it is thick at the bottom and the side surface near the bottom of the recess T, and becomes thin toward the opening of the recess T. As a result, the generation of voids when the silicon oxide film 202 is embedded in the recess T can be prevented.

According to the deposition method according to the embodiment, because the silicon oxide film 202 deposited in the recess T is exposed to the Ar plasma, the silicon oxide film 202 deposited on the bottom and the side surface near the bottom of the recess T is modified into a film having high etching resistance. As a result, the silicon oxide film 202 formed on the bottom and the side surface near the bottom of the recess T that is hard to be modified in the silicon oxide film formation step S12 is modified into a film having high etching resistance. As a result, the variation of the film quality in the depth direction of the recess T can be reduced.

EXAMPLE

Examples will be described in which the characteristics of silicon oxide films formed by the deposition method according to the embodiment are evaluated. In the examples, a silicon wafer is used as the substrate W.

Example 1

In Example 1, a silicon oxide film was formed inside a trench formed on a surface of a silicon wafer by the deposition method according to the embodiment, and the wet etching rate (WER) of the formed silicon oxide film was measured. In Example 1, the WER was the etching rate of the silicon oxide film when the silicon wafer on which the silicon oxide film was formed was immersed in 0.25% hydrofluoric acid (HF). In Example 1, the processing time with the Ar plasma in the plasma processing step S13 was set to 0 seconds (no processing), 30 seconds, 60 seconds, or 150 seconds. In Example 1, the set number of times in the determination step S14 was 5 times.

Figure 11:
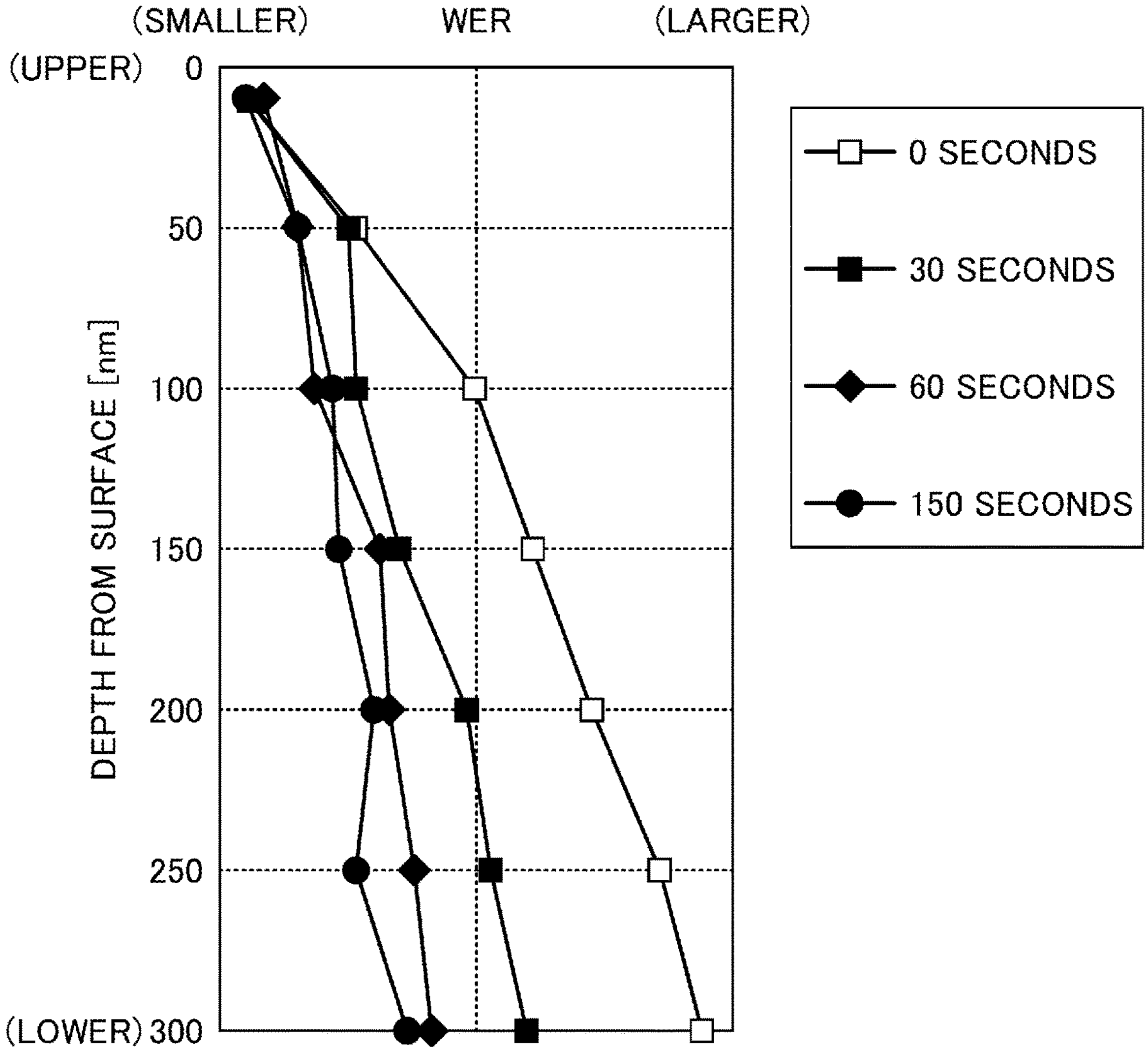
FIG. 11 diagram is presenting the a evaluation results of Example 1.

FIG. 11 is a diagram presenting the evaluation result of Example 1. FIG. 11 is a diagram presenting the WER distribution of the silicon oxide film in the depth direction of the trench. In FIG. 11, the horizontal axis indicates the WER, and the vertical axis indicates the depth (nm) from the silicon wafer surface. In FIG. 11, the blank square, the black square, the black diamond, and the black circle indicate the results when the processing time with the Ar plasma was 0, 30, 60, and 150 seconds, respectively.

As illustrated in FIG. 11, it can be seen that the silicon oxide film processed with the Ar plasma has a smaller WER at the bottom of the trench than the silicon oxide film not processed with the Ar plasma. From this result, it is indicated that, by performing the plasma processing step S13 after the silicon oxide film formation step S12, the film quality of the silicon oxide film at the bottom of the trench is improved and approaches that of the silicon oxide film at the top of the trench. That is, by performing the plasma processing step S13 after the silicon oxide film formation step S12, the variation of the film quality in the depth direction of the trench can be reduced when the silicon oxide film is formed in the trench.

As illustrated in FIG. 11, it can be seen that the silicon oxide films in which the processing time with the Ar plasma were 60 seconds and 150 seconds have a smaller WER at the bottom of the trench than the silicon oxide film in which the processing time with the Ar plasma was 30 seconds. From this result, it is indicated that the variation of the film quality in the depth direction of the trench can be further reduced when the processing time with the Ar plasma is set to 60 seconds or more.

Example 2

In Example 2, the depth to which the silicon oxide film is modified from the surface of the silicon oxide film when the film is processed with the Ar plasma was observed.

Figure 12:
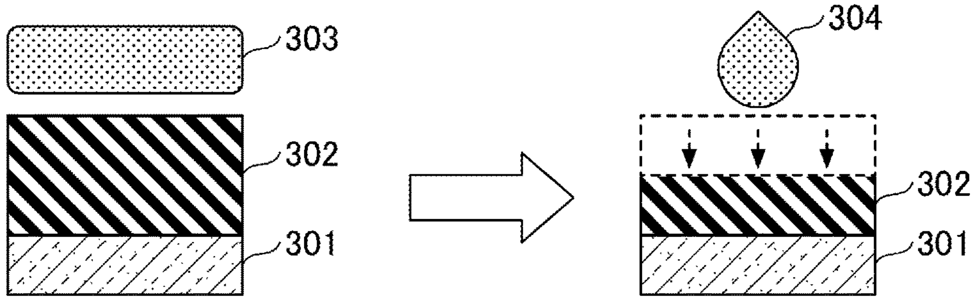
FIG. 12 is a diagram illustrating an evaluation method of Example 2.

FIG. 12 is a diagram for explaining the evaluation method of Example 2. First, as illustrated in the left diagram of FIG. 12, a silicon oxide film 302 was formed on a silicon wafer 301 by the silicon oxide film formation step S12 described above, and then the silicon oxide film 302 was exposed to an Ar plasma 303. The processing time with the Ar plasma was 0 seconds (no processing), 30 seconds, 60 seconds, 150 seconds, and 300 seconds. Subsequently, as illustrated in the right diagram of FIG. 12, by supplying 0.25% hydrofluoric acid 304 to the surface of the silicon oxide film 302, the silicon oxide film 302 was wet etched for a predetermined period of time, and the etching of the silicon oxide film 302 was measured. The smaller the etching amount of the silicon oxide film 302, the better the film quality of the silicon oxide film 302.

Figure 13:
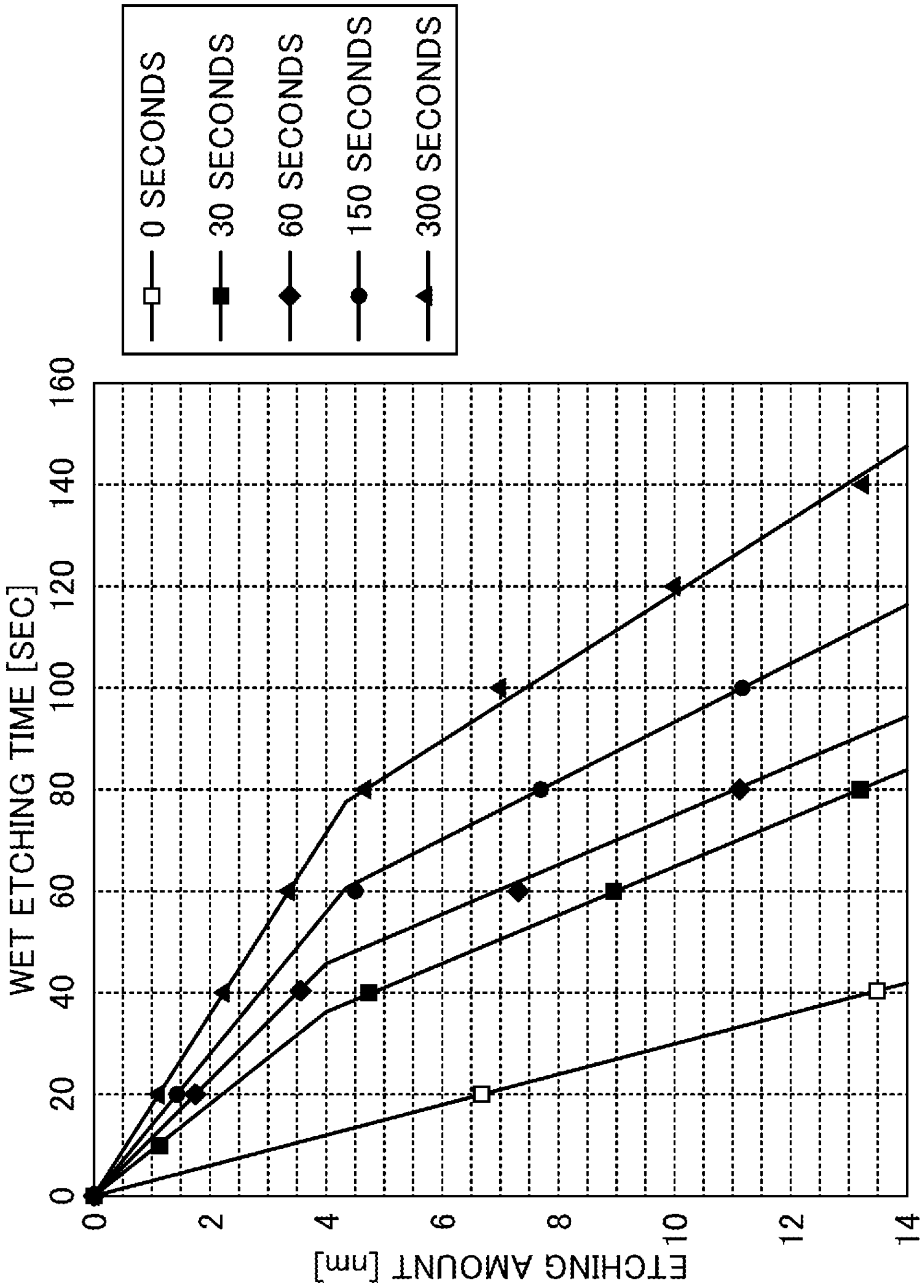
FIG. 13 is a diagram presenting the evaluation results of Example 2.

FIG. 13 is a diagram presenting the evaluation result of Example 2. FIG. 13 is a diagram presenting the relationship between the wet etching time and the etching amount of the silicon oxide film 302. In FIG. 12, the horizontal axis indicates the wet etching time [seconds] of the silicon oxide film 302, and the vertical axis indicates the etching amount [nm] of the silicon oxide film 302. In FIG. 12, the blank square, the black square, the black diamond, the black circle, and the black triangle indicate the results when the processing time with the Ar plasma was 0, 30, 60, 150, and 300 seconds, respectively.

As illustrated in FIG. 13, it can be seen that the silicon oxide film 302 processed with the Ar plasma has a lower etching amount per unit time (WER) than the silicon oxide film 302 not processed with the Ar plasma. From this result, it is indicated that, by processing the silicon oxide film 302 with the Ar plasma, the film quality of the silicon oxide film 302 is improved.

As illustrated in FIG. 13, it can be seen that, when the etching amount of the silicon oxide film 302 is 4 nm or less, the etching amount per unit time (WER) of the silicon oxide film processed with the Ar plasma is smaller than the WER of the silicon oxide film not processed with the Ar plasma. As illustrated in FIG. 13, it can be seen that, when the etching amount exceeds 4 nm, the WER of the silicon oxide film processed with the Ar plasma is almost the same as the WER of the silicon oxide film not processed with the Ar plasma. From these results, it is indicated that, when the processing time with the Ar plasma is 30 to 300 seconds, the silicon oxide film can be modified to approximately 4 nm from the surface by processing with the Ar plasma. Therefore, it is considered to be preferable to shift from the silicon oxide film formation step S12 to the plasma processing step S13 before the thickness of the silicon oxide film in the thickest part (for example, the bottom of the trench) exceeds 4 nm in the silicon oxide film formation step S12.

As illustrated in FIG. 13, when the etching amount of the silicon oxide film 302 is 4 nm or less, it can be seen that the longer the processing time with the Ar plasma, the smaller the etching amount per unit time. From this result, the processing time with the Ar plasma is preferably 30 seconds or more, more preferably 60 seconds or more, more preferably 150 seconds or more, and more preferably 300 seconds or more.

The embodiments disclosed here should be considered in all respects illustrative and not restrictive. The foregoing embodiments may be omitted, substituted, or modified in various forms without departing from the scope and intent of the appended claims.

In the foregoing embodiments, the case where the first reaction gas is an aminosilane gas is described, but the present disclosure is not limited thereto, and any gas that can be adsorbed to hydroxyl groups may be used. For example, the first reaction gas may be an organosilicon compound gas. For example, the first reaction gas may be an organometallic gas. Examples of the organometallic gas include zirconium (Zr) containing gas and aluminum (Al) containing gas.

In the foregoing embodiments, the case where the second reaction gas is an ozone gas is described, but the present disclosure is not limited thereto. For example, the second reaction gas may be an ozone gas, an oxygen gas ($O_2$), water ($H_2O$), a hydrogen peroxide gas ($H_2O_2$), or a gas mixture containing two or more of these. For example, a hydrogen gas may be added to the gas in the second reaction gas.

In the foregoing embodiments, the case where the noble gas is argon gas is described, but the present disclosure is not limited thereto. For example, the noble gas may be helium gas (He), neon gas (Ne), krypton gas (Kr), and xenon gas (Xe).

In the foregoing embodiments, the case where the modifying gas is ammonia gas is described, but the present disclosure is not limited thereto. For example, the modifying gas may be ammonia gas, oxygen gas, hydrogen gas ($H_2$), or a gas mixture containing two or more of these.

In the foregoing embodiments, the case where the plasma source 80 is an inductively coupled plasma (ICP) source including the antenna 85 is described, but the present disclosure is not limited thereto. For example, the plasma source 80 may be a capacitively coupled plasma (CCP) source that generates plasma by applying a high frequency between two rod electrodes that extend parallel to each other. Even when the plasma source 80 is a CCP source, the Ar/$NH_3$ plasma and the Ar plasma can be generated, so the above-mentioned effects can be achieved.

In the foregoing embodiments, the case where the deposition apparatus is a semi-batch type apparatus is described, but the present disclosure is not limited thereto. For example, the deposition apparatus may be a single-wafer type apparatus that processes substrates one by one. For example, the deposition apparatus may be a batch type apparatus that processes multiple substrates at once.

According to the present disclosure, when a film is formed in a recess, variation in film quality in the depth direction of the recess can be reduced.

What is claimed is:

1. A deposition method for forming a film in a recess of a substrate having the recess on a surface thereof, the method comprising:

a) depositing a film of a reaction product of a first reaction gas and a second reaction gas that react with each other in the recess; and b) exposing the substrate on which the film is deposited to a plasma generated from a noble gas in a state where a supply of the modifying gas is stopped, wherein a) is switched to b) before a thickness of the film deposited on a bottom of the recess exceeds 4 nm, wherein a) includes:

a1) exposing the substrate to a plasma generated from the noble gas and a modifying gas to adsorb a hydroxyl group on an inner surface of the recess in a predetermined distribution, a2) supplying the first reaction gas to the substrate on which the hydroxyl group is adsorbed, and a3) supplying the second reaction gas to the substrate on which the first reaction gas is adsorbed, thereby causing the first reaction gas to react with the second reaction gas to produce the reaction product.

2. The deposition method according to claim 1, wherein a) and b) are repeated multiple times in this order.

3. The deposition method according to claim 1, wherein a) and b) are performed in a same vacuum chamber, and b) is performed at a lower pressure in the vacuum chamber than a).

4. The deposition method according to claim 1, wherein in a) and in b), the substrate is maintained at a same temperature.

5. The deposition method according to claim 1, wherein the substrate is placed along a circumferential direction on a rotary table in a vacuum chamber, a first region for performing a1) and b), a second region for performing a2), and a third region for performing a3) are provided in the vacuum chamber above the rotary table along the circumferential direction of the rotary table, a) is repeatedly performed on the substrate by rotating the rotary table in a state where the noble gas and the modifying gas are supplied to the first region, the first reaction gas is supplied to the second region, and the second reaction gas is supplied to the third region, and b) is repeatedly performed on the substrate by rotating the rotary table in a state where a supply of the modifying gas to the first region, a supply of the first reaction gas to the second region, and a supply of the second reaction gas to the third region are stopped, and the noble gas is supplied to the first region.

6. The deposition method according to claim 1, wherein the first reaction gas is aminosilane gas.

7. The deposition method according to claim 2, wherein the first reaction gas is aminosilane gas.

8. The deposition method according to claim 3, wherein the first reaction gas is aminosilane gas.

9. The deposition method according to claim 4, wherein the first reaction gas is aminosilane gas.

10. The deposition method according to claim 5, wherein the first reaction gas is aminosilane gas.

11. The deposition method according to claim 6, wherein the second reaction gas is ozone gas.

12. The deposition method according to claim 11, wherein the noble gas is argon gas.

13. The deposition method according to claim 12, wherein the modifying gas is ammonia gas.

14. The deposition method according to claim 1, wherein a processing time for exposing the substrate to the plasma generated from the noble gas in b) is 60 seconds or more.

15. The deposition method according to claim 1, wherein in b), the plasma is generated from a gas consisting of argon gas.

* * * * *